July 22, 1969 G. KENT ET AL 3,457,366

AUTOMATIC GAIN CONTROL CIRCUIT

Filed June 24, 1966 2 Sheets-Sheet 1

George Kent
Richard J. Waring
BY Pendleton, Neuman, Seibold & Williams
Attorneys

AUTOMATIC GAIN CONTROL CIRCUIT

Filed June 24, 1966 2 Sheets-Sheet 2

George Kent
BY Richard J. Waring
Pendleton, Neuman,
Seibold & Williams
Attorneys 3,457,366

AUTOMATIC GAIN CONTROL CIRCUIT

George Kent, Fort Wayne, and Richard J. Waring, Auburn, Ind., assignors to The Magnavox Company, Fort Wayne, Ind., a corporation of Delaware Filed June 24, 1966, Ser. No. 560,262
Int. Cl. H04n *3/16, 5/44;* H04b *1/16*
U.S. Cl. 178—7.5 11 Claims

ABSTRACT OF THE DISCLOSURE

A television A.G.C. control circuit is disclosed having first and second circuits to control RF and IF gain, respectively. The rates of gain variation have four different states, each being assumed as received signal strength increases. In the first state with low signal strength RF and IF gain are both maximized. In the second, IF gain rapidly decreases while a series voltage dependent resistor in the first circuit holds RF gain at a maximum. A shunt diode lowers the rate of IF gain reduction while the RF gain reduces rapidly in the third state. A diode coupling the first and second circuits reduces the rate of RF gain reduction and increases that of IF gain reduction in the fourth state at high signal strength.

This invention relates to an automatic gain control circuit and more particularly to an automatic gain control circuit which operates in response to variations in received signal strength over an extremely wide range, to so control the gain of RF and IF amplifiers as to produce a substantially constant level of output signal while minimizing noise and distortions. The circuit of this invention is comparatively simple and straightforward in operation and uses a minimum number of component parts so as to be readily and economically manufacturable, while being extremely efficient and reliable in operation.

Although features of the invention have other applications, the circuit of this invention was particularly designed for use in a television receiver wherein it is highly desirable that the video output signal be developed at a substantially constant level with received signal strength varied over a wide range. It is known in the prior art that an automatic gain control voltage fed to an RF amplifier may be varied differently from the automatic gain control voltage applied to the IF amplifier. With this arrangement, the RF amplifier may be operated at maximum gain until the input signal has reached a certain value, to apply a signal with the highest possible amplitude to the mixer which inherently is a source of high noise generation. Thus a signal-to-noise ratio is obtained under weak signal conditions which is greater than would be the case if the RF amplifier gain were initially decreased. When the received signal strength increases sufficiently, the applied automatic gain control voltage is applied at a relatively rapid rate to avoid overloading of the RF amplifier.

With such prior art circuits, a substantial improvement in operation is obtained. It has been found, however, that the optimum conditions are not obtained at all received signal strength values, resulting in variations in the level of the output signal, and resulting in the generation of unnecessary noise and distortions in the output signal.

This invention was evolved with the general object of improving upon and overcoming the disadvantages of prior art automatic gain control circuits and of providing a circuit which is highly effective and efficient while being reliable and trouble-free in operation.

A more specific object of this invention is to provide a transistorized automatic gain control circuit designed for use with transistorized RF and IF amplifiers.

According to an important feature of this invention, separate gain control signals are applied to RF and IF amplifiers with at least one of the gain control signals being effective in different received signal strength ranges to reduce the gain of the corresponding amplifier at different rates, as contrasted with prior systems in which the gain of the IF amplifier is reduced at a generally constant rate and in which the gain of the RF amplifier is reduced at a constant rate after the signal strength value set by the delay circuit is exceeded. It is found that with a variable gain reduction rate, it is possible to approach much more closely the optimum gains of the respective amplifiers, required to maintain the level of the output voltatge constant while minimizing noise and distortions.

According to a specific feature of the invention, the gain of the IF amplifier is rapidly reduced with the received signal strength increasing up to a certain value, preferably on the order of one millivolt, and is then gradually reduced with the received signal strength increasing above that value. At the same time, the RF amplifier is operated at maximum gain up to the certain value and is thereafter rapidly reduced with received signal strength increasing above the certain value. With this feature, it is possible to obtain operation which closely approaches optimum operation, particularly in weak and medium signal strength ranges.

According to another specific feature of the invention, the gain of the IF amplifier is reduced at a greater rate above a second received signal strength value, preferably on the order of 1.25 volts, while the RF gain is reduced at a rate less than the rapid reduction obtained at strengths below the second value. With this arrangement, it is possible to obtain operation which closely approaches optimum operation, particularly with strong received signal strengths.

With a combination of the above two specific features, three different modes of operation are obtained, one being obtained with weak received signal strength values, another being obtained with medium received signal strength values and the third being obtained with strong received signal strength values.

In accordance with a further feature of the invention, a fourth mode of operation may be obtained with extremely weak received signal strength values, wherein both the IF amplifier and the RF amplifier are operated at maximum gain.

Another important feature of the invention relates to the provision of first and second coupling circuits for developing the IF and RF gain control signals from a primary control voltage signal which is so developed as to be proportional to the level of the output signal of the detector. Preferably, the primary control voltage signal is developed by means of a keyed automatic gain control circuit including a transistor which is keyed into conduction by flyback pulses to charge a capacitor in proportion to the amplitude of the detector output signal during horizontal retrace intervals.

A further important feature is in the use of a voltage dependent resistor in one of the coupling circuits, the resistor being preferably coupled between the primary control voltage source and the base electrode of a transistor operated as an emitter-follower. With this feature, it is possible to obtain the desired rapid reduction in the gain of the RF amplifier, with a smooth transition between the weak signal and medium signal modes of operation.

Still another feature of the invention is in the provision of a diode coupled between the outputs of the coupling circuits to increase the rate of reduction of gain of the IF amplifier while reducing the rate of reduction of gain of the RF amplifier, in a strong received signal strength range.

Yet another feature of the invention is in the use of a diode to reduce the rate of reduction of the gain of the IF amplifier in a medium received signal strength range.

This invention contemplates other objects, features and advantages which will become more fully apparent from the following detailed description taken in conjunction with the accompanying drawings which illustrate a preferred embodiment and in which.

Figure 1:
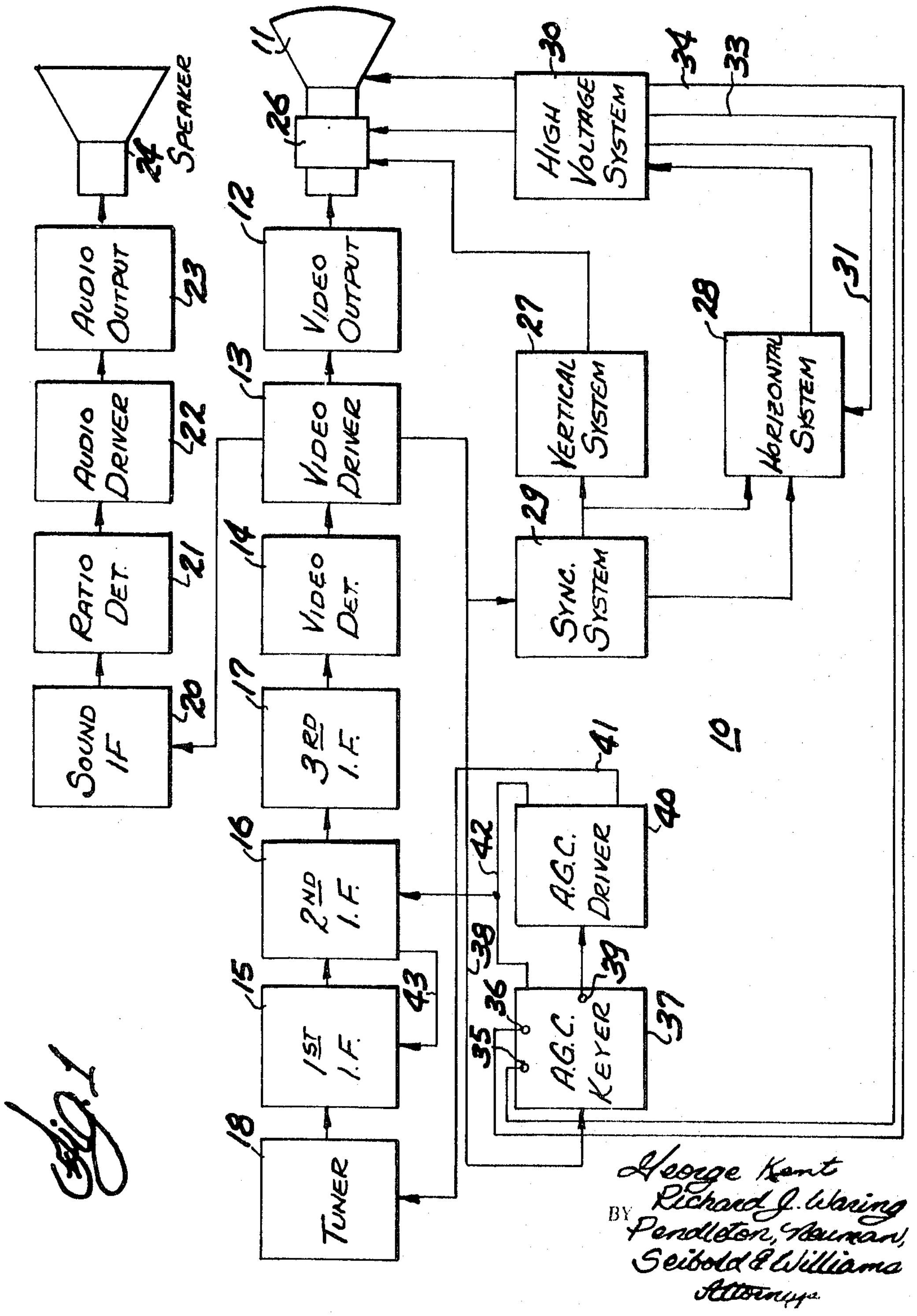
FIGURE 1 is a schematic block diagram of a television receiver constructed in accordance with the principles of this invention.

Reference numeral 10 generally designates a receiver constructed in accordance with the principles of this invention. The invention is particularly concerned with automatic gain control circuitry shown in FIGURE 2, but the overall construction and operation of the receiver will be first described with reference to the block diagram of FIGURE 1.

The receiver 10 comprises a picture tube 11 having a conventional electron gun structure to which a video signal is applied from a video output stage 12, driven by a video driver stage 13, which receives a video signal from a video detector 14. The detector 14 receives a modulated signal from an IF amplifier having first, second and third stages 15, 16 and 17, an input IF signal being applied to the first stage 15 from a tuner 18. The tuner 18 comprises an RF amplifier stage, an oscillator and a converter or mixer, the mixer being operative to beat the amplified RF signal from the amplifier stage against the oscillator signal to produce the IF signal which is applied to the first IF stage 15.

An output of the video driver 13 is applied to a sound IF amplifier 20 which supplies an amplified IF signal to a ratio detector 21, operative to produce an audio signal which is amplified by audio driver and audio output stages 22 and 23, to be applied to a speaker 24.

Vertical and horizontal deflection coils of a deflection yoke assembly 26 are connected to outputs of vertical and horizontal deflection systems 27 and 30 which are supplied with synchronizing signals from a synchronizing system 29 having an input connected to an output of the video driver stage 13. A high voltage system 30 is provided having an output connected to the anode of the picture tube 11 and having an input connected to an output of the horizontal system 28. The high voltage system 30 includes a transformer having windings which develop flyback pulses during horizontal retrace intervals, one of such windings being connected through a line 31 to the horizontal system 28, and another of such windings being connected through lines 33 and 34 to terminals 35 and 36 of an automatic gain control keyer stage 37. An input of the keyer stage 37 is connected through a line 38 to an output of the video driver stage 13.

The automatic gain control keyer stage 37 has an output terminal 39 at which a primary gain control voltage signal is developed. The signal from terminal 39 is applied to an automatic gain control driver stage 40 which includes a coupling circuit utilizing a transistor operated as an emitter-follower to develop a gain control signal on a line 41 which is applied to an RF amplifier of the tuner 18. The driver stage 40 may also include a coupling circuit operative to develop another gain control signal on a line 42 which is applied to the second IF stage 16 to control the gain thereof. The second IF stage 16 is connected through a line 43 to the first IF stage 15 to control the gain thereof in accordance with the signal applied on line 42.

Figures 2, 3:
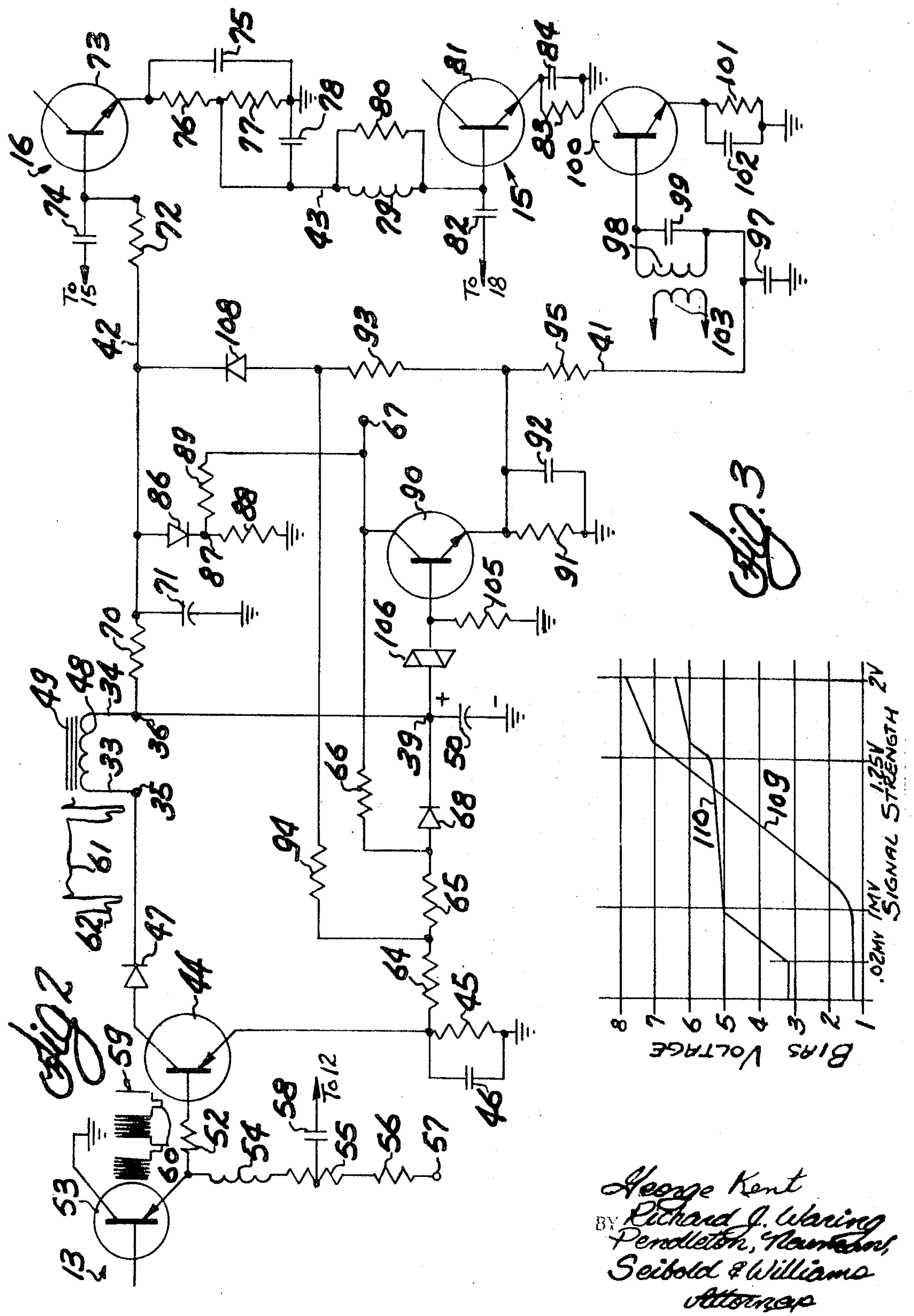
FIGURE 2 is a circuit diagram showing the circuits of an AGC keyer stage and an AGC driver stage, together with portions of RF and IF amplifier stages and a video driver stage.
FIGURE 3 is a graph wherein IF and RF gain control voltages are plotted against received signal strengths, for explaining the operation of the circuits shown in FIGURE 2.

Referring now to FIGURE 2, the AGC keyer stage 37 comprises a transistor 44 having an emitter connected to ground through the parallel combination of a resistor 45 and a capacitor 46. The collector of transistor 44 is connected through a diode 47 to the terminal 35 which as schematically indicated is connected through the line 33 to one terminal of a winding 48 of a transformer 49 in the high voltage system, a flyback pulse being developed across winding 48 during horizontal retrace intervals having a polarity as indicated on the drawing. The other terminal of winding 48 is connected through the line 34 to the terminal 36 which is directly connected to a circuit point forming the terminal 39, connected through a capacitor 50 to ground.

The base of the transistor 44 is connected through a resistor 52 to the emitter of a transistor 53 in the driver stage 13, the collector of transistor 53 being connected to ground and the base thereof being connected to the output of the video detector stage 14.

The emitter of transistor 53 is connected through an RF choke 54 to one end of a potentiometer 55 the opposite end of which is connected through a resistor 56 to a positive power supply terminal 57. An adjustable contact of the potentiometer 55 is connected through a capacitor 58 to the input of the video output stage 12.

In the operation of the circuit as thus far described, a video signal is applied to the base of the transistor 44 having a waveform as indicated by reference numeral 59 and including synchronizing pulse portions 60, while a signal is applied between terminals 35 and 36 having a waveform as indicated by reference numeral 61, including flyback pulses 62 developed during horizontal retrace intervals. The flyback pulses 62 are applied in a direction to tend to render the transistor 44 conductive and if the video signal applied to the base of the transistor 44 is of sufficient amplitude during the horizontal retrace intervals, the transistor 44 is rendered conductive to charge the capacitor 50 with a polarity as indicated on the drawing, to develop a primary gain control signal having an amplitude approximately proportional to the amplitude of the video signal applied to the base of the transistor 44.

The transistor 44 is so biased that it does not conduct until the video signal exceeds a certain amplitude. For this purpose, the emitter thereof is connected through resistors 64, 65 and 66 to a power supply terminal 67 which may be at a positive voltage of 12 volts relative to ground, for example. The emitter of the transistor 44 is thus placed at a positive potential relative to ground, but at a negative potential relative to the emitter of the transistor 53 of the video driver stage, with no video signal output. By way of example, the relative values of resistors 45, 64, 65 and 66 may be such as to place the emitter of transistor 44 at a positive potential of 1 volt relative to ground, while the emitter of the video driver stage transistor 53 may be at a positive potential of 3.7 volts with no video signal applied.

A diode 68 is connected between the terminal 39 and the junction between resistors 65 and 66 to normally charge the capacitor 50 and place the potential of the terminal 39 at a certain positive value relative to ground, with no video signal applied. The purpose of this feature is to apply bias voltages to the RF and IF amplifiers such as to obtain maximum gain under very weak received signal strength conditions.

A coupling circuit is provided between the terminal 39 and the line 42 at which a first gain control signal is developed, for application to the second IF stage 16. In particular, terminal 39 is connected through a resistor 70 to the line 42, a capacitor 71 being connected between line 42 and ground. As shown in FIGURE 2, line 42 is connected through a resistor 72 to the base of a transistor 73 in the second IF stage 16, the base being connected through a coupling capacitor 74 to the output of the first IF stage 15. The emitter of transistor 73 is connected to ground through a capacitor 75 and through a pair of resistors 76 and 77. The collector thereof is connected to an IF transformer (not shown) in conventional fashion.

With this arrangement, the bias of the transistor 73 is controlled in response to the voltage developed at terminal 39. With no video signal present, the bias is maintained at a value such as to obtain maximum gain. By way of example, the base of the transistor 73 may be at a positive voltage of 3.5 volts relative to ground, when no video output signal is developed.

To control the gain of the first IF stage 15, the junction between resistors 76 and 77 is connected to the line 43 which is connected through a capacitor 78 to ground and which is connected through the parallel combination of an RF choke 79 and a resistor 80 to the base of a transistor 81 of the first IF stage 15. The base of the transistor 81 is connected through a capacitor 82 to the output of the tuner 18, the emitter of transistor 81 is connected through a resistor 83 and a capacitor 84 to ground, and the collector of transistor 81 is connected to a primary winding of an IF transformer (not shown) and through the capacitor 74 to the base of the transistor 73 of the second IF stage 16.

It is noted that the gain control signals applied to the transistors 73 and 81 are applied in a forward direction, the bias of the transistors 73 and 81 being increased to increase conduction thereof, in response to an increased voltage at the line 42. Although the conduction of the transistors 73 and 81 is increased, the IF gain thereof is decreased when the forward bias is increased to a certain level, due to the fact that the slope of the characteristic curves of the transistors decreases as collector current is increased. This type of automatic gain control action is the reverse of that obtained with conventional vacuum tube amplifier circuits and in many transistor circuits, but is advantageous in permitting a wider range of control of gain while minimizing noise generation and distortions.

In accordance with an important feature of the invention, the gain control signal on line 42 is increased at differing rates in different received signal strength ranges. In particular, a diode 86 is connected between the line 42 and a circuit point 87 which is connected through a resistor 88 to ground and through a resistor 89 to power supply terminal 67. The values of resistors 88 and 89 are such that the circuit point 87 is at a potential more positive than that of the line 42, with no video output signal being developed. By way of example, the potential of the circuit point 87, with no video output signal applied to the keying transistor 44 may be 4.2 volts, while the potential of the line 42 may be 3.5 volts. When an increasing video output signal is applied to the base of the keying transistor 44, the potential of the line 42 is increased at a rapid rate until it exceeds the potential of the circuit point 87. The diode 86 then begins to conduct and the potential of the line 42 then increases at a much lower or more gradual rate.

To control the gain of the RF amplifier in the tuner 18, a coupling circuit is provided between terminal 39 and the line 41 which comprises a transistor 90 operated as an emitter-follower, having a collector connected to the power supply terminal 67. The emitter of transistor 90 is connected to ground through the parallel combination of a resistor 91 and a capacitor 92 and through resistors 93 and 94 to the junction between resistors 64 and 65. The emitter of transistor 90 is additionally connected to the line 41 through a resistor 95.

In the tuner 18, line 41 may be connected through a capacitor 97 to ground and through a coil 98 in parallel with a tuning capacitor 99 to the base of a transistor 100 having an emitter connected to ground through a resistor 101 and a capacitor 102. A received signal may be applied to a coil 103, inductively coupled to the coil 98, and the collector of transistor 100 may be coupled through a suitable circuit to a mixer in the tuner stage 18, to which a local oscillator signal may be applied, the mixer being effective to beat the amplified received signal against the oscillator signal, to produce an IF signal which is applied to the input of the first IF stage 15.

It is noted that the gain control signal is applied in a forward direction to the RF amplifier transistor 100, to control the gain thereof in the same manner as in the IF stages, as above described.

The base of transistor 90 is connected through a resistor 105 to ground and through a voltage dependent resistor 106 to the terminal 39.

In operation, the transistor 90 does not conduct during weak signal reception when the voltage dependent resistor 106 has a relatively large resistance such that the base of the transistor 90 is at a relatively low positive potential which may be on the order of 0.5 volt, for example. The resistances of the resistors 91, 93 and 94 are such that the emitter of the transistor 90 is at a greater positive potential which may be 1.5 volts, for example, to insure that the transistor 90 does not conduct during weak signal conditions. At this time, the potential of the line 41 is approximately the same as that of the emitter of transistor 90 and a bias is applied to the RF amplifier transistor 100 such as to obtain maximum gain.

As the video output signal applied to the keyer stage 44 increases to increase the potential of the terminal 39, the voltage across the resistor 106 increases to decrease the resistance thereof, resulting in a proportionately greater rate of increase in the potential of the base of the transistor 90. At a certain point, the transistor 90 begins to conduct to increase the potential of the emitter thereof and to apply an increasingly positive voltage to the line 41 and to reduce the gain of the RF amplifier transistor 100 at a relatively rapid rate. The point at which the transistor 90 begins to conduct is preferably approximately the same as that at which the diode 86 starts to conduct. Thus the RF gain is reduced at a rapid rate while the IF gain is reduced at a relatively gradual rate.

In accordance with a further feature of the invention, the rates of gain reduction are again changed when the received signal strength increases to a certain level. In particular, the junction between resistors 93 and 94 is connected through a diode 108 to the line 42. The values of the voltage-dividing resistors are such that the potential of the junction between resistors 93 and 94 is normally less than that of the line 42 so that the diode 108 does not conduct. However, when the potential of the emitter of transistor 90 reaches a certain level, the potential of the junction between resistors 93 and 94 is placed at a level higher than that of the line 42 and the diode 108 begins to conduct. Thereafter, with an increasing level of the video output signal, the conduction through diode 108 and resistor 93 is such that the voltage at the base of transistor 73 increases at a more rapid rate while the voltage of the emitter of transistor 90 increases at a less rapid rate.

The above-described operations are illustrated graphically in FIGURE 3, wherein curves 109 and 110 are plots of the RF and IF gain control voltages on lines 41 and 42, respectively. As shown, the RF gain control voltage is at a level of slightly less than 1.5 volts and the IF gain control voltage 110 is at a level of slightly more than 3 volts when the received signal strength is less than 0.02 millivolt. At this time, the keying transistor 44 and also the driver stage transistor 90 are non-conductive, the voltages being determined by the applied power supply voltage and the values of the various voltage-dividing resistors in the circuit.

When the received signal strength exceeds 0.02 millivolt, the keying transistor 44 starts to conduct to increase the potential of the terminal 39 and to increase the potential of the IF gain control line 42 at a relatively rapid rate, to rapidly reduce the gain of the IF amplifier stages. At the same time, the driver transistor 90 remains non-conductive, so that the RF amplifier transistor 100 is operated at maximum gain.

When the received signal strength reaches aproximately 1 millivolt, the diode 86 begins to conduct to decreases the rate of increase of the voltage on the line 42 and to make the reduction in the gain of the IF stages more gradual. At this time, also, the transistor 90 begins to conduct and the voltage of the line 41 increases at a high rate to rapidly reduce the gain of the RF amplifier transistor 100.

When the received signal strength reaches approximately 1.25 volts, the diode 108 starts to conduct to increase the rate of increase of the voltage on the line 42 while reducing the rate of increase of the voltage on the line 41. Thus the rate of reduction of the gain of the IF amplifier stages is increased while the rate of reduction of the gain of the RF amplifier transistor 100 is decreased.

By way of illustrative example, and not by way of limitation, the various components of the circuit may have values according to the following table:

| Reference numeral: | | Value |
|---|---|---|
| 45 | ohms | 100 |
| 46 | microfarads | 50 |
| 50 | do | 4 |
| 52 | ohms | 1800 |
| 54 | microhenries | 4 |
| 55 | ohms | 600 |
| 56 | do | 100 |
| 64 | do | 150 |
| 65 | do | 100 |
| 66 | do | 560 |
| 70 | do | 5600 |
| 71 | picofarads | 2200 |
| 75 | do | 2200 |
| 76 | ohms | 91 |
| 77 | do | 470 |
| 78 | picofarads | 2200 |
| 79 | microhenries | 4 |
| 80 | ohms | 220 |
| 83 | do | 330 |
| 84 | picofarads | 2200 |
| 88 | ohms | 680 |
| 89 | do | 1300 |
| 91 | do | 680 |
| 92 | microfarads | 2 |
| 93 | ohms | 100 |
| 94 | do | 560 |
| 95 | do | 100 |
| 105 | do | 47,000 |

The supply voltages applied to terminals 57 and 67 may be plus 12 volts.

The voltage dependent resistor 106 may preferably be a Carborundum type 432 BNR–63 varistor having a characteristic such that the current flow therethrough is 1 milliampere when the voltage thereacross is 12 volts and such that the current flow therethrough is approximately 0.01 milliampere when the voltage thereacross is 3 volts.

It will be understood that variations and modifications may be effected without departing from the spirit and scope of the novel concepts of this invention. The system may be useful in association with various cascade amplification systems, that is, multiple stage amplification systems where each stage amplifies a signal from the preceding stage. The invention, however, has special significance where as here, the optimum signal strength in each stage produces advantages in reduced noise and the like. The cascade system may include both conventional amplifier devices and other signal translating stages such as converters, mixers, gainless drivers and the like.

We claim as our invention:

1. In a receiver including a tuner for converting a received signal to an IF signal, said tuner including an RF amplifier an IF amplifier for amplifying said IF signal, and detector means for demodulating the amplified IF signal to develop an output signal, automatic gain control means responsive to said output signal applying a first gain control signal to said IF amplifier and a second gain control signal to said RF amplifier and comprising means for developing a primary control voltage signal proportional to the level of said detector output signal, a first coupling circuit for developing said first gain control signal from said primary control voltage signal, and a second coupling circuit for developing said second gain control signal from said primary control voltage signal, one of said coupling circuits comprising a voltage dependent resistor and a transistor operated as an emitter-follower and having base, emitter and collector electrodes, said voltage dependent resistor being coupled between said base electrode and said primary control voltage developing means.

2. In a receiver including a tuner for converting a received signal to an IF signal, said tuner including an RF amplifier, an IF amplifier for amplifying said IF signal, and detector means for demodulating the amplified IF signal to develop an output signal, automatic gain control means responsive to said output signal applying a first gain control signal to said IF amplifier and a second gain control signal to said RF amplifier and comprising means for developing a primary control voltage signal proportional to the level of said detector output signal, a first coupling circuit having an output for developing said first gain control signal from said primary control voltage signal, and a second coupling circuit having an output for developing said second gain control signal from said primary control voltage signal, and a diode coupled between the outputs of said first and second coupling circuits.

3. In a receiver including a tuner for converting a received signal to an IF signal, said tuner including an RF amplifier, an IF amplifier for amplifying said IF signal, and detector means for demodulating the amplified IF signal to develop an output signal, automatic gain control means responsive to said output signal applying a first gain control signal to said IF amplifier and a second gain control signal to said RF amplifier and comprising means for developing a primary control voltage signal proportional to the level of said detector output signal, a first coupling circuit having an output for developing said first gain control signal from said primary control voltage signal, a second coupling circuit having an output for developing said second gain control signal from said primary control voltage signal, and a diode arranged to reduce the rate of increase of the output of one of said coupling circuits when it exceeds a certain value.

4. In a receiver including a tuner for converting a received signal to an IF signal, said tuner including an RF amplifier, an IF amplifier for amplifying said IF signal, and detector means for demodulating the amplified IF signal to develop an output signal, automatic gain control means responsive to said output signal and comprising first circuit means including a D.C. biased device having a unilateral conduction characteristic for applying a first gain control signal to said IF amplifier being effective to rapidly reduce the gain of said IF amplifier with received signal strength increasing up to a certain value and to then gradually reduce the gain of said IF amplifier with received signal strength increasing above said certain value and a second circuit means including a device having a resistance which varies with the voltage applied to it for applying a second gain control signal to said RF amplifier being effective to operate said RF amplifier at maximum gain with received signal strength up to a specific value and to then rapidly reduce the gain of said RF amplifier with received signal strength increasing above said specific value.

5. In a receiver as defined in claim 4, said certain received signal strength value being on the order of 1 millivolt.

6. In a receiver as defined in claim 4, said first control signal being effective to operate said IF amplifier at maximum gain with received signal strength up to a value substantially below said certain value.

7. In a receiver including a tuner for converting a received signal to an IF signal, said tuner including an RF amplifier, an IF amplifier for amplifying said IF signal, and detector means for demodulating the amplified IF signal to develop an output signal, automatic gain control means responsive to said output signal and comprising first circuit means having an output for applying a first gain control signal to said IF amplifier being effective with received signal strength increased above a certain value to reduce the gain of said IF amplifier at a rate greater than a gradual gain reduction rate obtained at a strength below said certain value, and second circuit means having an output for applying a second gain control signal to said RF amplifier being effective with received signal strength increased above a specific value to reduce the gain of said RF amplifier at a rate less than a rapid reduction obtained at strengths below said specific value, said first and second circuit means including a device having a unilateral conduction characteristic coupled between the outputs of said first and second circuit means.

8. In a receiver as defined in claim 7, said certain received signal strength value being on the order of 1.25 volts.

9. In a receiver as defined in claim 4, said first gain control signal being effective with received signal strength increased above a second certain value substantially greater than said certain value to reduce the gain of said IF amplifier at a rate greater than said gradual gain reduction rate obtained at strengths between said certain value and said second value, said second gain control signal being effective with received signal strengths above a second specific value substantially greater than said specific value to reduce the gain of said RF amplifier at a rate less than said rapid reduction obtained at strengths between said specific value and said second specific value, and said automatic gain control means further comprising a device having a unilateral conductive characteristic coupled between said first and second means.

10. In a receiver including a tuner for converting a received signal to an IF signal, said tuner including an RF amplifier, an IF amplifier for amplifying said IF signal, detector means for demodulating the amplified IF signal to develop an output signal, and D.C. power supply means, automatic gain control means applying a first gain control signal to said RF amplifier and a second gain control signal to said IF amplifier comprising a capacitor responsive to said output signal and a device having a unilateral conductive characteristic coupled between said power supply means and said capacitor such that said capacitor charges to a level proportional to the amplitude of said output signal at a received signal strength above a certain value and is charged to a fixed level such that said first and second gain control signals produce maximum gain in said RF and IF amplifiers at a received signal strength below said certain value.

11. In a receiver including a tuner for converting a received signal to an IF signal, said tuner including an RF amplifier, an IF amplifier for amplifying said IF signal, and detector means for demodulating the amplified IF signal to develop an output signal, automatic gain control means responsive to said output signal for minimizing the noise and distortion in said output signal at all levels of received signal strength applying a first gain control signal to said IF amplifier and a second gain control signal to said RF amplifier and comprising control means for developing a primary control voltage signal proportional to the level of said detector output signal with received signal strength above a first level and fixed at a specific level effective to maximize the gain of said IF amplifier and said RF amplifier with received signal strength below said first level, first circuit means for applying said first gain control signal to said IF amplifier being effective to reduce the gain of said IF amplifier at a first average rate with received signal strength between said first level and a second level, to reduce the gain of said IF amplifier at a second average rate less than said first average rate with received signal strength between said second level and a third level, and to reduce the gain of said IF amplifier at a third rate greater than said second average rate with received signal strength above said third level, and second circuit means for applying said second gain control signal to said RF amplifier being effective to maximize the gain of said RF amplifier with received signal strength between said first and second levels, to reduce the gain of said RF amplifier at a fourth average rate with received signal strength between said second and third levels, and to reduce the gain of said RF amplifier at a fifth rate less than said fourth average rate with received signal strength above said third level.

References Cited

UNITED STATES PATENTS

| | | | |
|---|---|---|---|
| 2,834,877 | 5/1958 | Milwitt | 325—405 |
| 3,205,444 | 9/1965 | Birkenes | 325—404 |
| 3,344,355 | 9/1967 | Massman | 325—405 |

RICHARD MURRAY, Primary Examiner

ALFRED H. EDDLEMAN, Assistant Examiner

U.S. Cl. X.R.

325—404, 405